United States Patent [19]
Liu et al.

[11] Patent Number: 5,580,380
[45] Date of Patent: Dec. 3, 1996

[54] METHOD FOR FORMING A DIAMOND COATED FIELD EMITTER AND DEVICE PRODUCED THEREBY

[75] Inventors: Jiang Liu, Raleigh; Scott Wolter, Zebulon; Michael T. McClure, Raleigh; Brian R. Stoner, Chapel Hill; Jeffrey T. Glass, Apex; John J. Hren, Cary, all of N.C.

[73] Assignee: North Carolina State University, Raleigh, N.C.

[21] Appl. No.: 380,079

[22] Filed: Jan. 30, 1995

Related U.S. Application Data

[63] Continuation-in-part of Ser. No. 937,481, Aug. 28, 1992, Pat. No. 5,397,428, which is a continuation-in-part of Ser. No. 811,425, Dec. 20, 1991, abandoned.

[51] Int. Cl.⁶ .................................................... C30B 29/04
[52] U.S. Cl. ............................... 117/86; 117/95; 117/103; 117/929; 427/577
[58] Field of Search .................... 117/86, 929, 95, 117/103; 427/577; 357/56; 313/495

[56] References Cited

U.S. PATENT DOCUMENTS

| | | | |
|---|---|---|---|
| 3,998,678 | 12/1976 | Fukase et al. | 156/3 |
| 4,168,213 | 9/1979 | Hoeberechts. | |
| 5,126,287 | 6/1992 | Jones . | |
| 5,129,850 | 7/1992 | Kane et al. . | |
| 5,138,237 | 8/1992 | Kane et al. . | |
| 5,141,460 | 8/1992 | Jaskie et al. . | |
| 5,199,918 | 4/1993 | Kumar . | |
| 5,203,731 | 4/1993 | Zimmerman | 445/24 |
| 5,258,685 | 11/1993 | Jaskie et al. . | |
| 5,283,501 | 2/1994 | Zhu et al. . | |
| 5,285,089 | 2/1994 | Das | 257/197 |
| 5,290,610 | 3/1994 | Kane et al. . | |
| 5,410,166 | 4/1995 | Kennel | 257/77 |
| 5,449,970 | 9/1995 | Kumor et al. | 313/495 |

FOREIGN PATENT DOCUMENTS

| | | |
|---|---|---|
| 0512129A1 | 11/1992 | European Pat. Off. . |
| 63-035495 | 2/1988 | Japan . |
| 2260641 | 4/1993 | United Kingdom . |

OTHER PUBLICATIONS

Wolter et al, "Textured Growth of Diamond on Silicon via In Situ Carburization and Bias–enhanced Nucleation", Applied Physics Letters 62(11) pp. 1215–1217 1993.

Geis, et al., *Diamond Cold Cathodes*, Elsevier Science Publishers B. V., 1991, pp. 309–310.

Liu, et al., *Diamond Thin Film Coated Si Field Emitters*, NCSU Research Adm., Sep. 2, 1994, pp. 8–11.

*Primary Examiner*—Robert Kunemund
*Attorney, Agent, or Firm*—Bell, Seltzer, Park & Gibson

[57] ABSTRACT

A method for making a field emitter comprising the steps of providing a projection; electrically biasing the projection; and exposing the electrically biased projection to a hydrocarbon containing plasma to form a layer of diamond nuclei on the projection. The diamond nuclei are relatively inert and have a high nucleation density. The projection is preferably a material capable of forming a carbide, such as (111) oriented silicon. Refractory metals may also be used for the projection. The electrical biasing is preferably at a voltage in a range of about −150 to −250 volts. The hydrocarbon containing plasma preferably comprises a plasma including about 2 to 5% by weight of methane in hydrogen. An intervening carbide layer is preferably formed at a surface of the projection and underlying the layer of diamond nuclei. The field emitter produced by the method and having a relatively high diamond nucleation density is also disclosed.

49 Claims, 5 Drawing Sheets

METHOD FOR FORMING A DIAMOND COATED FIELD EMITTER AND DEVICE PRODUCED THEREBY

GOVERNMENT RIGHTS

The Government of the United States of America has rights in this invention pursuant to Contract No. N-00014-93-1-437 awarded by the Office of Naval Research/Ballistic Missile Defense Organization.

RELATED APPLICATIONS

This application is a continuation-in-part of application. Ser. No. 07/937,481 filed Aug. 28, 1992, now U.S. Pat. No. 5,397,428, which is a continuation-in-part of application Ser. No. 07/811,425 filed Dec. 20, 1991, now abandoned.

FIELD OF THE INVENTION

The invention relates to the area of microelectronic devices, and, more particularly, to a field emitter and a method for forming same.

BACKGROUND OF THE INVENTION

With its large energy band gap and other unique physical properties, diamond is regarded as a desirable material for many engineering applications including wear-resistant tool coatings, optical windows for visible and infrared transmission, abrasives, and particularly high temperature electronic devices. Diamond can be used as a high-grade, radiation resistant, high-temperature semiconductor with potential application in many commercial, military, and aerospace technologies. Thus, there is considerable interest in finding and improving techniques for synthesizing diamond films for these and other applications.

The study of heteroepitaxial growth of diamond films is currently of great interest not only as a subject of basic research but also for a variety of applications of diamond films. By taking full advantage of its unique physical and chemical properties, such as high thermal conductivity and negative electron affinity, diamond may be an ideal material for the new generation of solid state electronic devices. (See, for example, G. S. Gildenblat, S. A. Grot, C. R. Wronski, and A. R. Badzian, *Proc. IEEE* 79, 647 (1991)).

Several new Schottky and ohmic contact structures, based on CVD diamond films, have been fabricated and evaluated during recent years. In the new emerging field of vacuum microelectronics, silicon remains as a favored cathode material because of its well-established microprocessing technology. It may also be desirable, from the applicable device point of view, to have a thin film of diamond on the silicon surface in order to enhance the operating current, as well as the stability of the device.

Various techniques for forming diamond films have been proposed. For example, U.S. Pat. No. 4,915,977 to Okamoto et al. proposes forming a diamond film by evaporating carbon onto the substrate by arc discharge at a carbon cathode and applying a negative bias voltage to the substrate so as to form a plasma glow discharge around the substrate. U.S. Pat. No. 4,830,702 to Singh et al. proposes a hollow cathode plasma assisted method and apparatus for forming diamond films. Unfortunately, such electrical discharge methods for forming diamond films often fail to produce high quality diamond films.

Microwave plasma enhanced CVD has also been used to form diamond films. In addition, techniques have been developed for enhancing the nucleation of diamond onto a silicon substrate, or other substrate, for the subsequent growth of a diamond film by a conventional growth process. For example, it is known that the diamond nucleation density on a substrate may be increased several orders of magnitude by simply scratching or abrading the substrate prior to placing it into the conventional CVD growth chamber. Although the size and density of grown diamond particles can be controlled to some extent by the size and density of the scratches, each diamond particle still grows in a random orientation. In addition, the maximum density of diamond nuclei is also typically limited to less than about $10^9/cm^2$.

Other attempts have been made to more effectively seed a nondiamond substrate, such as by spraying the substrate with diamond powder through an air brush, or by ultrasonically abrading the substrate surface. U.S. Pat. No. 4,925,701 to Jansen et al. proposes seeding a substrate with a diamond powder to enhance nucleation. Unfortunately, each of these types of preparation techniques has to be performed outside of the plasma CVD reaction chamber.

The scratching and seeding techniques, also fail to produce a surface which is sufficiently smooth to permit in-situ monitoring of the diamond growth rate. Therefore, ex-situ analysis is commonly used, such as cross-sectional scanning electron microscopy or profilometry. Such ex-situ analysis does not permit processing parameters to be controlled during the diamond growth process. Moreover, scratching or abrading a surface may destroy fine features, such as the tip of a field emitter.

An article entitled *Generation of Diamond Nuclei by Electric Field in Plasma Chemical Vapor Deposition*, by Yugo et al. appearing in Applied Physics Letters, 58 (10) pp. 1036–1038, Mar. 11, 1991, proposes a predeposition of diamond nuclei on a silicon mirror surface prior to the conventional diamond CVD growth process. A high methane fraction (i.e., at least 5 percent) in the feed gas is taught by Yugo along with a negative electrical bias of 70 volts negative with respect to ground applied to the substrate for a time period of just several minutes.

The Yugo article also proposes that a balance must be struck between the biasing voltage and the methane content of the gas mixture. The authors of the Yugo article theorize that an excessive acceleration of the ions from a high voltage can destroy newly formed diamond nuclei. Yugo suggests that revaporization of the newly formed diamond nuclei should be suppressed by mitigating the ion impact by keeping the magnitude of the bias voltage low. Thus, in order to offset the low bias voltage, the degree of carbon over saturation, as determined by the methane percentage, should be increased. Yugo reported that diamond nuclei growth did not occur below 5% methane content and that high densities of nuclei occurred only above 10% methane. In addition, the absolute value of the biasing voltages were maintained below 200 volts negative with respect to ground to avoid revaporization from high energy impacting ions. The total time duration for the pretreatment was limited to between 2 to 15 minutes.

Growth of epitaxial diamond thin films on Si (100), (110), and (111) flat substrates has been studied by several investigators. (See, for example, S. D. Wolter, B. R. Stoner, J. T. Glass, and et al., *Appl. Phys. Lett.*, 62 (11), 1215 (1993); and X. Jiang, K. Schiffmann, A. Westtphal, and C. P. Klages, *Appl. Phys. Lett.*, 63 (9), 1203 (1993)). Unfortunately, it is difficult to deposit a high density diamond film on nonplanar surface, such as may be used in a field emitter. In addition, conventional field emitters, such as silicon field emitters, may suffer tip wear and oxidation, thereby reducing performance.

Previous studies have demonstrated that thin films of silicon carbide were producible on nanometer-scaled silicon field emitters without altering the geometrical structures of the emitters significantly as disclosed in J. Liu, U. T. Son, A. N. Stepanova, and et al., *J. Vac. Sci. Technol.* B12 (2), p. 717, Mar./Apr. (1994). Improved performance was achieved on these SiC coated emitters as compared to the pure Si ones.

Considering the facts of known diamond nucleation size and density, appropriate processing conditions must accommodate the highly curved surface geometries of the Si emitters. An article to Geis et al. entitled Diamond Cold Cathodes, from Applications of Diamond Films and Related Materials, p. 309–310 (1991) discloses a diamond mesa field emitter.

U.S. Pat. Nos. 5,258,685 and 5,129,850 each discloses covering a field emitter tip with a diamond coating by ion implantation of carbon atoms to provide a substantially uniform plurality of nucleation sites from which diamond growth is initiated. The patents further disclose that coating thickness on the order of 10 Angstroms to less than 5000 Angstroms are desirable and that irregularities in coating thickness and coverage be minimized. In addition, the implanted carbon nucleation sites discourages the formation of non-uniform coating which may include undesirably large crystallite growth.

U.S. Pat. No. 5,199,918 to Kumar discloses a diamond field emitter formed by selectively depositing a (111) oriented diamond film, forming a metal layer over the diamond film and etching the portion of the metal film to expose the peaks of the diamond crystals. U.S. Pat. No. 5,138,237 to Kane et al. and U.K. Published Application No. 2,260,641 to Miyata et al. disclose other diamond field emitters.

U.S. Pat. No. 5,141,460 to Jaskie et al. discloses an electron emitter including a layer of diamond on a selectively formed conductive or semiconductive electrode. Carbon ions are implanted at a surface of the electrode by an ion beam to thereby serve as nucleation sites for subsequent diamond deposition. Similarly, U.S. Pat. No. 5,290,610 to Kane et al. discloses a diamond coated silicon field emitter formed by disposing hydrocarbon and etchant reactant gasses together with the tip in a reaction vessel and providing an external voltage source such that electrons, emitted from the electron emitter, disassociate hydrocarbon constituents of the reactant gas. The constituents accelerate toward and are deposited onto the tip and are selectively etched by the etchant, such as hydrogen, so that the diamond form of the deposited carbon preferably remains. Unfortunately, a significant percentage of carbon may remain on the surface as nondiamond carbon, thus, reducing the effectiveness of the diamond. Accordingly, field emission characteristics and stability may be less than desirable.

SUMMARY OF THE INVENTION

With the foregoing background in mind, it is therefore an object of the present invention to provide a method for making a field emitter and a field emitter produced thereby having a high quality diamond coating thereon to provide enhanced stability and field emission characteristics.

It is another object of the invention to provide a method for making a field emitter and field emitter produced thereby having a tip with a small radius of curvature and being resistant to wear and oxidation.

These and other objects, advantages, and features of the present invention are provided by a method comprising the steps of: providing a projection; electrically biasing the projection; and exposing the electrically biased projection to a hydrocarbon containing plasma to form a layer of diamond nuclei on the projection. The diamond nuclei are relatively inert and have a high nucleation density to thereby provide increased current density, emission efficiency, and emission stability for the field emitter.

In particular, the projection is preferably a material capable of forming a carbide, such as (111), (110) or (100) oriented silicon. Refractory metals may also be used for the projection including molybdenum, tungsten, titanium, and hafnium.

In addition, the step of exposing the electrically biased projection to a hydrocarbon containing plasma comprises exposing the electrically biased projection to a hydrocarbon containing plasma at a predetermined temperature, a predetermined pressure and for a predetermined time to form an intervening carbide layer at a surface of the projection and underlying the layer of diamond nuclei. The intervening carbide layer preferably has a thickness in a range of about 20 to 100 Angstroms at a surface of the projection and underlying the layer of diamond nuclei.

The step of electrically biasing the projection comprises electrically biasing the projection at a predetermined voltage in a range of about −150 to −250 volts, and, more preferably at about −200 volts. The step of exposing the electrically biased projection to a hydrocarbon containing plasma preferably comprises exposing the electrically biased projection to a plasma comprising about 2 to 5% by weight of methane in hydrogen.

The electrically biased projection is preferably exposed to the hydrocarbon containing plasma at a pressure in a range of about 10 to 30 Torr, at a temperature in a range of about 500° to 900° C., and for a time in a range of about 5 to 30 minutes. The predetermined temperature, predetermined pressure and predetermined time are also preferably selected to produce a relatively high nucleation density of the layer of nucleated diamond of greater than about $10^{10}/cm^2$. The method may preferably further comprise the step of depositing diamond onto the diamond nuclei. During deposition, the methane concentration may be reduced to 0.2 to 2%. The deposited diamond preferably produces a diamond layer including a plurality of diamond grains having a size of less than about 10 nanometers.

The method preferably includes the step of cleaning the projection prior to electrically biasing same. The cleaning is preferably performed by exposing the projection to a hydrogen containing plasma. In addition, the projection is preferably formed having a radius of curvature of less than about 30 nanometers which may be formed by the steps of chemical etching and oxidizing a projection to thereby sharpen same.

The field emitter produced according to the method preferably includes a projection comprising a material capable of forming a carbide; a carbide layer on the projection; and a diamond layer on the carbide layer. The projection preferably comprises (111), (110) or (100) oriented silicon or a refractory metal capable of forming a carbide. The diamond layer preferably has a nucleation density of greater than about $10^{10}/cm^2$. In addition, the diamond layer preferably comprises a plurality of diamond grains each having a size of less than about 10 nanometers.

Another embodiment according to the invention is a microelectronic device for producing ions. The microelectronic device includes a projection, a diamond layer on the projection, an electrode spaced from the projection, and means for supplying a gas to be ionized into a region between the projection and the electrode. The projection preferably comprises a material capable of forming a carbide, and a carbide layer is preferably formed between the projection and the diamond layer.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, applicants provide these embodiments so that this disclosure will be thorough and complete, and will fully convey the scope of the invention to those skilled in the art. Like numbers refer to like elements throughout. The thickness of films and regions are exaggerated for clarity.

Figure 1:
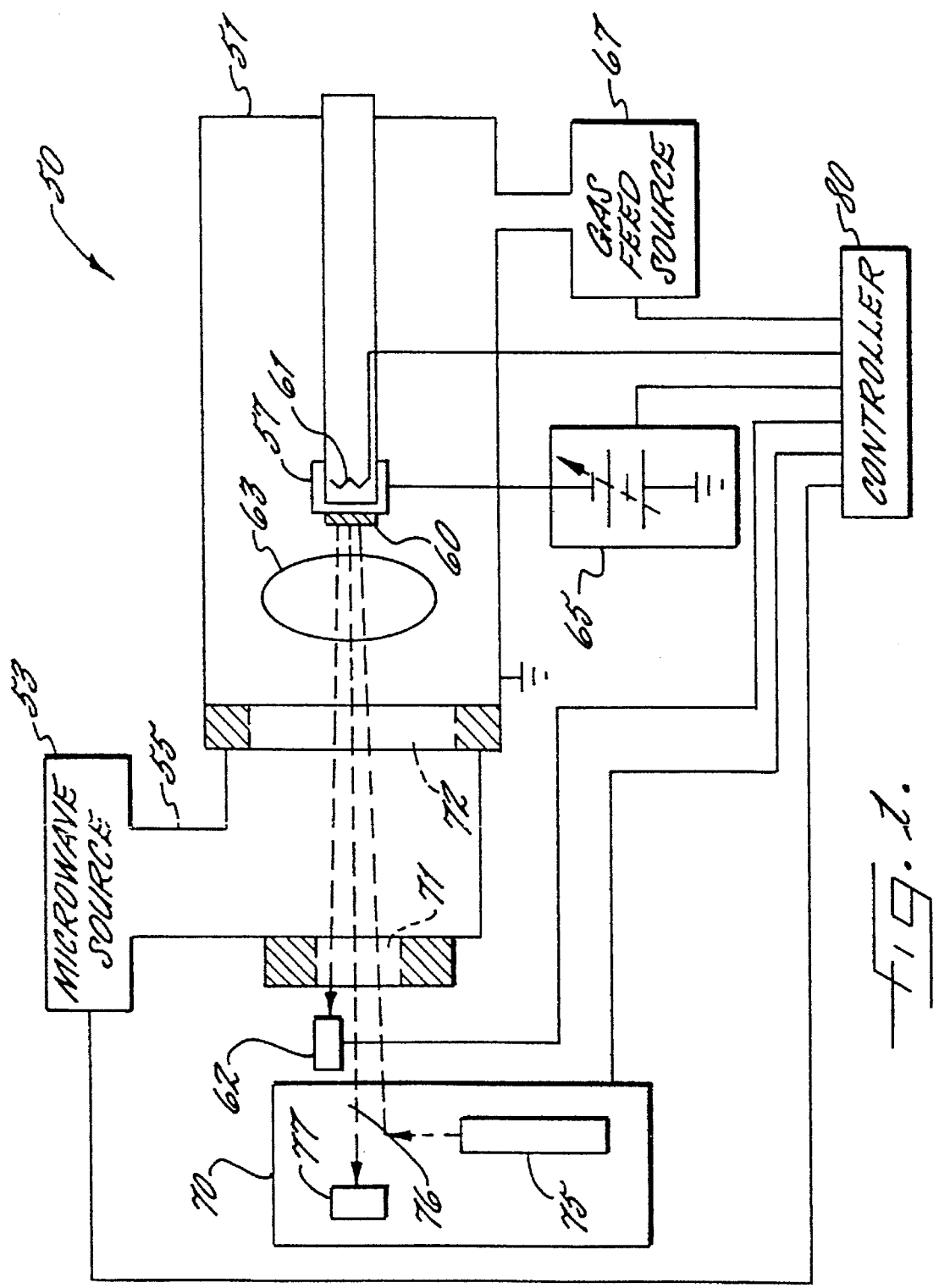
FIG. 1 is a schematic diagram of an apparatus for practicing the method according to the invention.

A schematic representation of the CVD apparatus according to the present invention is generally designated as 50 in FIG. 1. The CVD apparatus 50 preferably includes a conventional CVD reactor 51, such as an ASTeX microwave plasma CVD reactor available from ASTeX Company of Woburn, Mass. as described in U.S. patent application Ser. No. 07/937,481 filed Aug. 28, 1992 and incorporated herein in its entirety by reference.

The apparatus 50 has a controllable microwave power source 53 coupled to the reactor 51 by a rectangular waveguide section 55 to generate a plasma 63 within the reactor. The microwave power source 53 may be an ASTeX S-1000, 2.45 GHz microwave supply. The reactor 51 further includes a retractable substrate holder 57 positioned therein.

A substrate 60 to be processed is positioned on the substrate holder 57 and a heater 61 (e.g., a tantalum heater) associated with the substrate holder is used to control the substrate temperature independent of the plasma power. The temperature of the substrate 60 may be measured by a conventional optical pyrometer 62.

Figure 2:
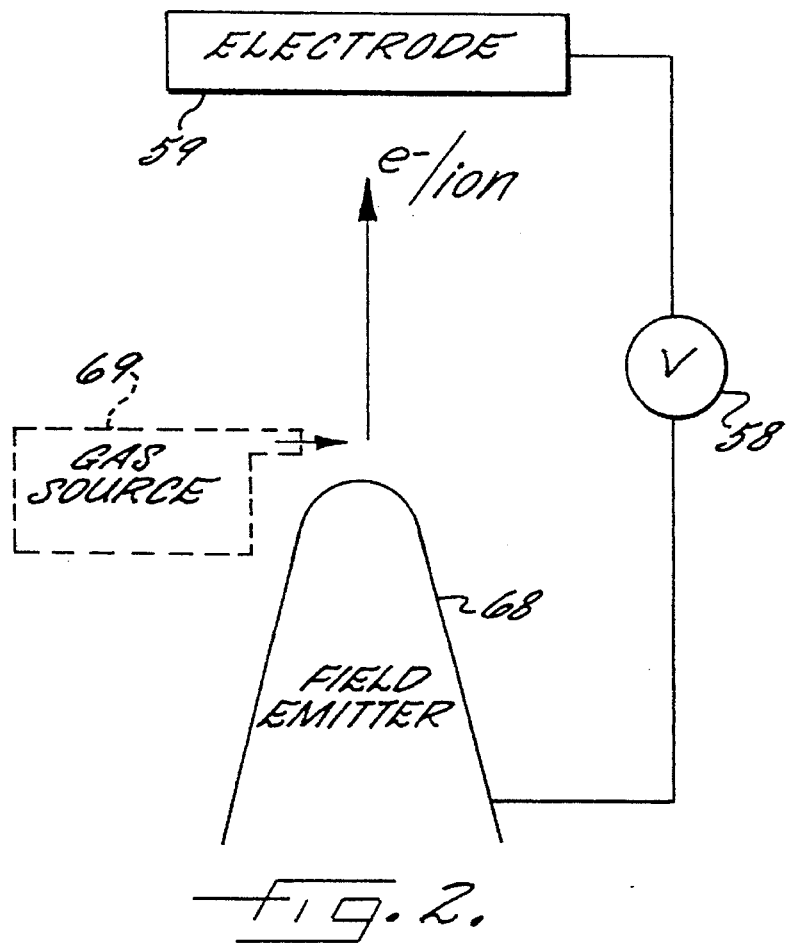
FIG. 2 is a schematic side elevational view of a field emitter in accordance with the present invention.
Figure 3:
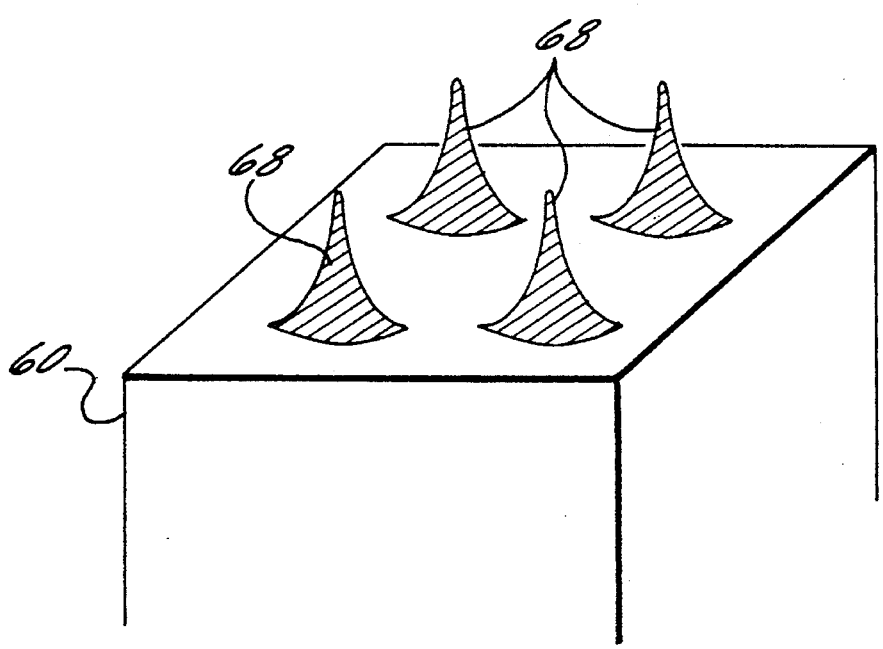
FIG. 3 is a perspective schematic view of an array of field emitters in accordance with the present invention.

As shown in FIGS. 2 and 3, the substrate 60 includes one or more needles or projections defining a field emitter 68 which may be processed in the illustrated apparatus 50 to form a diamond coating or layer thereon. As would be readily understood by those skilled in the art, the field emitter 68 may be used in cooperation with an opposing electrode 59 and connected voltage supply 58 to generate a flow of charged particles, such as electrons. In addition, a single field emitter may be used or combined with other emitters in an array configuration. Accordingly, the field emitter may be advantageously used in many microelectronic devices, such as scanning electron microscopes, transmission electron microscopes, miniaturized electron beam sources, and to provide electron emitter sources for cathode luminescence.

In addition, the field emitter 68 may also be used to produce ions. In particular, a gas source 69 may be used to supply a gas to be ionized by the field emitter and toward the opposing electrode 59, as would be readily understood by those skilled in the art.

The plasma 63 forms at a stable position in a medial portion of the reactor 51. The substrate 60 position relative to the plasma 63 may be varied between 0 (immersed in the plasma) and 8 centimeters by moving the retractable substrate holder 57 with respect to the reactor 51. The substrate holder 57 is connected to a controllable DC power supply 65 in the illustrated embodiment to electrically bias the substrate holder 57 with respect to ground. Alternately, the substrate holder may be isolated from ground so that it is at a floating electrical potential, or the substrate holder may be connected to ground, such as during growth of diamond on the pretreated substrate. Other electrical bias power supplies may be used in addition to the illustrated DC power supply 65 which provides a pure DC bias. For example, a conventional pulsed-DC power supply, AC (60 Hz) power supply, or RF power supply may also be used to bias the substrate holder 57.

A conventional gas feed source 67, including a vacuum pump and/or other conventional process pumps, are connected to the reactor 51. The gas feed source 67 controls the pressure within reactor 51 and the gas flow rate, as well as the mixture of feed gasses.

The substrate having the projections thereon is preferably cleaned in an $H_2$ plasma at about 25 Torr for 10 to 20 minutes at a temperature which increases during cleaning from about 500° to 800° C. The substrate holder is then preferably biased at a value of −150 to −250 volts, and, more preferably, about −200 volts, with respect to electrical ground. Pulsed DC, AC, and RF may be used to bias the substrate holder. Preferably the carbon-containing plasma has an atomic percentage of carbon of not more than about 0.3 atomic percent, such as provided by a plasma gas mixture including not more than about 5 percent by weight of methane, and more preferably not more than about 2 percent methane by weight. Other carbon-containing gasses may also be used including those selected from the group consisting of ethane, ethylene, acetylene, acetone, ethanol, carbon dioxide, $CCl_4$, $C_2Cl_4H_2$, $CCl_3CF_3$, $CCl_3CH_2OH$ inclusive of aliphatic hydrocarbons with from about 1 to about 10 carbon atoms per molecule.

The pretreatment or bias enhanced nucleation is preferably carried out for a predetermined time, such as for about 5 to 30 minutes and, more preferably, 20 to 25 minutes for obtaining a high nucleation density and with an electrical bias of 150 to 250 volts, and, more preferably, about 200 volts negative with respect to ground for a projection having a radius of curvature of about 30 nm. The bias enhanced nucleation is preferably carried out at a temperature of 500° to 900° C. and, more preferably, 550° to 600° C., and at a pressure of 10 to 30 Torr.

It has also been found that the electrical bias should be discontinued after the bias enhanced nucleation if it is further necessary to deposit diamond onto the diamond nucleation sites. Accordingly, diamond may be further deposited onto the nucleated diamond by first removing the electrical bias. During this further deposition, the methane concentration may be reduced to 0.2 to 2% and the duration of growth may be up to about 45 minutes. The deposited diamond preferably produces a diamond layer including a plurality of diamond grains having a size of less than about 10 nanometers.

The method according to the present invention has also been found to produce high nucleation density which makes possible more complete and thinner diamond films, particularly for forming a field emitter 68. In addition, better adhesion of the diamond film may be obtained by the method according to the invention.

The material of the projection is preferably silicon having a (111), (110) or (100) orientation. Refractory metals may also be used for the projection including molybdenum, tungsten, titanium, and hafnium. Some of these metals may require an additional preparation step, such as abrading in an ultrasonic bath as would be readily understood by those skilled in the art.

Using silicon as the projection material provides a high nucleation density without typically requiring scratching or abrading the emitter tip or projection surface. The bias enhanced nucleation allows a film composed of small grains to form in a relatively short time over a surface having a relatively small radius of curvature in the range of several tens of nanometers or less. In addition, an intervening carbide layer also forms from upper surface portions of the projection.

Applicants theorize, without wishing to be bound thereto, that the relatively high electrical bias of the present invention creates a higher saturation of diamond growth (carbon) species and thus helps to stabilize the existing nuclei already formed on the substrate. Applicants also theorize that the lower concentration of the carbon-containing gas during the bias enhanced nucleation produces a better quality diamond. As the methane concentration is increased for example, more undesirable graphite and amorphous carbon may be incorporated into the diamond. Little, if any, graphite is formed on the projection surface if low methane concentrations are used. In contrast, a higher methane (and higher carbon) concentration is likely to form graphite in the early stages of the biasing. Additionally, if diamond then nucleates on the graphite, the adhesion of the diamond film to the projection is likely to be very poor.

The following Example is illustrative of the present invention and should not be construed as limiting thereof.

EXAMPLE

Negative biasing pretreatment, preceded by an $H_2$ plasma cleaning step, allowed a conversion layer of SiC to form on Si and diamond to nucleate on the SiC. Such a pretreatment method is very suitable for making diamond coated field emitters and for the study of diamond nucleation on the surface of field emitters, since it does not involve any scratching by diamond abrasives or other conventional forms of nucleation enhancement, therefore avoiding the possibilities of tip damage and over-sized diamond crystal growth.

Figure 4:
FIG. 4 is an SEM micrograph of an array of field emitters in accordance with the present invention.

The low pressure diamond growth was performed on n-type (111) oriented single crystal Si whiskers which were fabricated by a vapor-liquid-solid (VLS) mechanism (E. I. Givargizov, *J. Vac. Sci. Technol.*, B11 (2), 449 (1993)). These whiskers were sharpened by subsequent procedures of chemical etching and oxidation to achieve the nanometer scale radii of curvatures as shown schematically in FIG. 3 and in an SEM micrograph of FIG. 4 which each illustrates the Si projections 68 in an array configuration. These Si tips usually have radii of curvatures about 30 nm or less and are ideal samples for studies of field emission/field ion microscopies (FEM/FIM) and high resolution electron microscopes. Transmission electron microscopy (TEM), for example, can easily be performed on these tips without any further sample preparation. It eliminates any post-treatment altering or damaging of the specimen and has been an important advantage for the present invention.

The three-step diamond growth process, involving $H_2$ plasma cleansing, bias enhanced nucleation, and deposition, was carried out in a UHV MPCVD reactor chamber 51 as described above with reference to FIG. 1. The Si specimens were first cleaned by concentrated HF solution for removing the native oxide before loading into the growth chamber. The in vacuo cleaning step was undertaken by immersing the Si samples in microwave plasma 63 with an $H_2$ pressure of 15 to 25 Torr. The applied microwave power was 600 watts, while the substrate was maintained at a temperature of 500° to 800° C. for a period of about 15 to 20 minutes. The temperature on the Si specimen was generated by the plasma 63, as well as by a substrate heater 61 and was monitored by an optical pyrometer 62 as would be readily understood by those skilled in the art.

The biasing step, which is referred to herein as bias enhanced nucleation (BEN), was performed immediately following the $H_2$ cleaning where the $CH_4/H_2$ ratio was increased to 5% and a bias potential of −200 VDC was applied to the specimen substrate 60. The microwave power was about 600 watts, the pressure was about 25 Torr, and the bias current was about 80 milliamps. In addition, the temperature was maintained between 850° to 900° C. A biasing time period of between 5 to 25 minutes was used in the experiments. SEM and TEM studies were performed before and after these processes.

Following the biasing step, the substrate voltage was removed, the methane concentration reduced to 0.2 to 2.0%, and the pressure was maintained at 25 Torr for the diamond deposition process, which usually lasted 15 to 45 minutes for the particular specimens. The deposition process further enhanced the preceding diamond nucleation, as well as the epitaxial growth of the diamond film.

High resolution electron microscopies, performed on a JEOL 6400F field emission SEM and two additional TOPCON 002B TEMs, were used to study the surface morphology and interfacial structures of the resultant emitters. Field emission characterizations were performed in a UHV FEM/FIM system.

Figure 5:
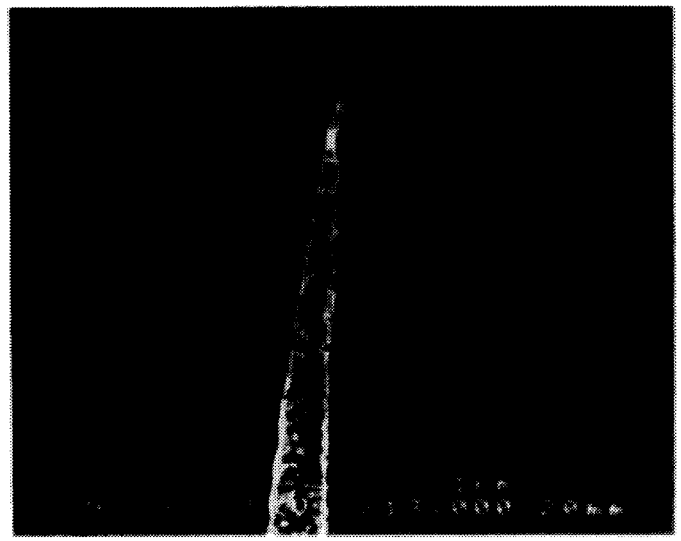
FIG. 5 is an SEM micrograph of a single crystal silicon field emitter after bias enhanced nucleation in accordance with the present invention.

It was found in the experiments that under the negative biasing condition diamond can start to nucleate on the Si emitter surface within 5 minutes after the $H_2$ plasma cleaning step. The negative BEN treatment activated processes of carburization, as well as diamond nucleation on the Si surface. The nucleation density, varying with biasing time as well as location, was measured to exceed $10^{10}/cm^2$ for a 20 minute biasing treatment. This is considerably higher than the result on a flat substrate under the same conditions. FIG. 5 shows a typical single crystal Si tip after it was treated by negative biasing for 20 minutes. The formation of stable diamond nuclei was significantly enhanced by the negatively biased surface on which surface atoms or adatoms are more effectively activated by increased bombardment of positively charged energetic ions. The local field distribution, and thus the flux of charged particles, is considered as the main contributor to the variation of local nucleation density.

Figure 6:
FIG. 6 is a TEM diffraction pattern for a diamond coated field emitter in accordance with the present invention.

After the BEN process, polycrystalline structures of diamond and a SiC interlayer were found on the Si emitter by high resolution TEM analyses. The structures were further confirmed by TEM diffraction studies. FIG. 6 shows a diffraction pattern of the nucleated diamond surface and the SiC interlayer. The rings match very well with the corresponding crystallographic orientations of diamond. Single crystal diamond grains, ranging from a few nanometers to several tens of nanometers, were found in the diamond layer. The thickness of the SiC interlayer was measured to be between 20 to 100 Angstroms. One or more faint rings corresponding to SiC can be observed in diffraction images like FIG. 6. The experimental results have further verified that the BEN process on Si first creates a SiC layer on which diamond starts to nucleate due to enhancement of the C—C bonding.

It has been found that an intensified carburization process can produce a single crystal SiC conversion layer as well as epitaxial diamond growth on a planar substrate surface (S. D. Wolter, B. R. Stoner, J. T. Glass, and et al., *Appl. Phys. Lett.*, 62 (11), 1215 (1993)). However, these intensified conditions and diamond nucleation may be beyond the scale which is required for a field emitter. It was also found that the deposition process after BEN enlarged the size of existing diamond grains in proportion to the process time. In order to maintain the geometry of the field emitter, minimal diamond deposition times were used and sometimes even eliminated.

Figure 7:
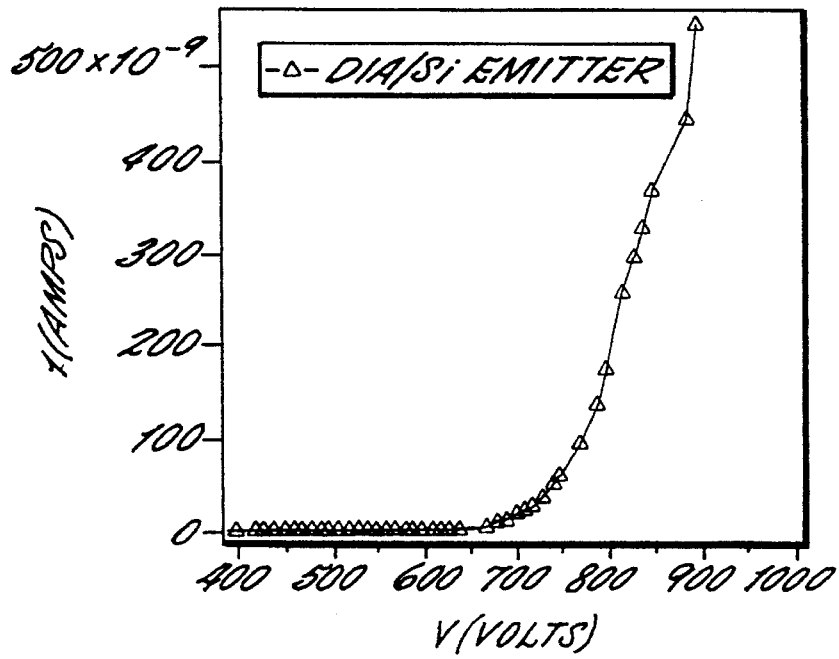
FIG. 7 is a graph of field emission characteristics of a diamond coated field emitter in accordance with the present invention.
Figure 8:
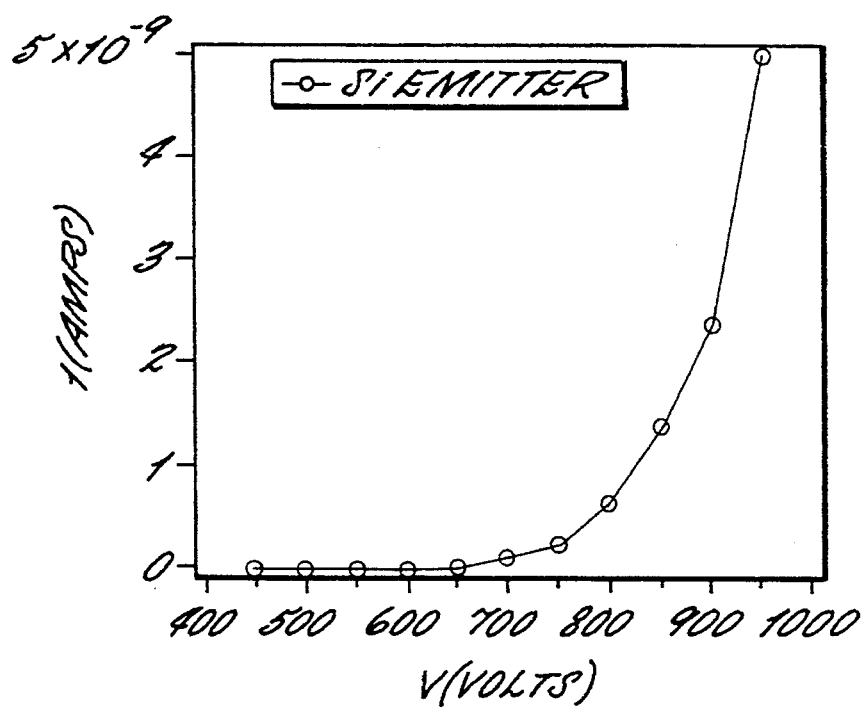
FIG. 8 is a graph of field emission characteristics of a silicon field emitter as in the prior art.
Figure 9:
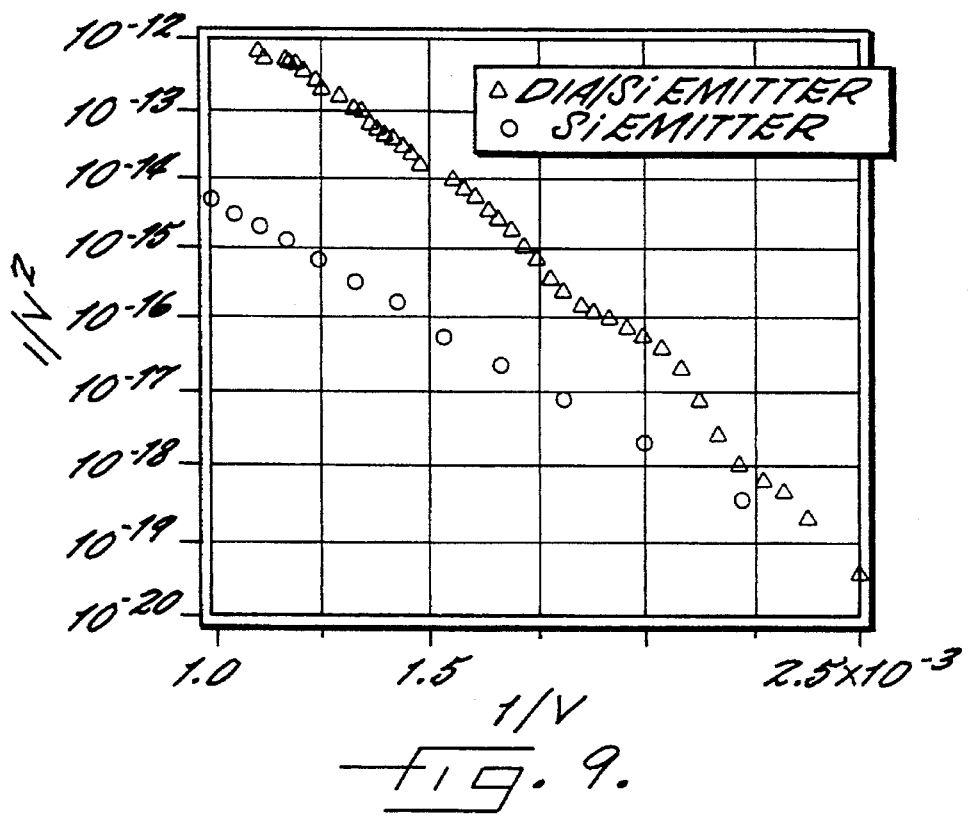
FIG. 9 is a graph of field emission characteristics of a diamond coated field emitter in accordance with the present invention compared to a silicon field emitter.

Field emission current-voltage (I–V) measurements were performed on diamond coated Si single emitters, as well as on multi-emitter arrays. The tip-to-anode distance was kept at 10 mm and the vacuum was at the low $10^{-9}$ Torr range or better. Emission data from each sample was taken by several consecutive measurements. A total emission current of a few μA per tip both from pure Si and diamond coated emitters was easily obtained. To avoid tip destruction, however, the field emission experiments were carried out under mid-range current density at this stage for the purpose of analysis. Two sets of I–V measurements, one from a diamond coated single tip and one from a single pure Si tip are shown in FIGS. 7 and 8, respectively. The data were analyzed using the Fowler-Nordheim equation as well as related curve fitting and calculations to produce the corresponding Fowler-Nordheim plots as shown in FIG. 9.

Very interesting results were obtained from diamond coated emitters. The emission exhibited exceptional stability as well as reproducibility. An unusually large emitting area was obtained compared to the pure Si samples which demonstrated consistency to previous results. Measured from both single and multi-emitter array, the emitting area was determined to be between $10^{-12}$ to $10^{-11}$ $cm^2$. This happens to correspond to the entire surface area of the tip whose radius of curvature was estimated to be about 300 Angstroms. Meanwhile, measurements from pure Si and other metal emitters were very similar to those obtained by other investigators. Field emission in such cases showed a very small emitting area of about $10^{-16}$ $cm^2$, which corresponds to only one or a few atomic sites. Surprisingly, the emitting behavior from a diamond coated emitter surface according to the invention implied a full surface emission. Compared to a conventional field emitter whose surface is usually covered with unstable adsorbates or contaminants, diamond's chemically inert surface is much more stable and therefore has the potential to emit electrons from a larger area. Although this mechanism is still under investigation, we theorize without wishing to be bound thereto that it could be very significant for enhancing the total emission current and suppressing emitter disruption.

Figure 10:
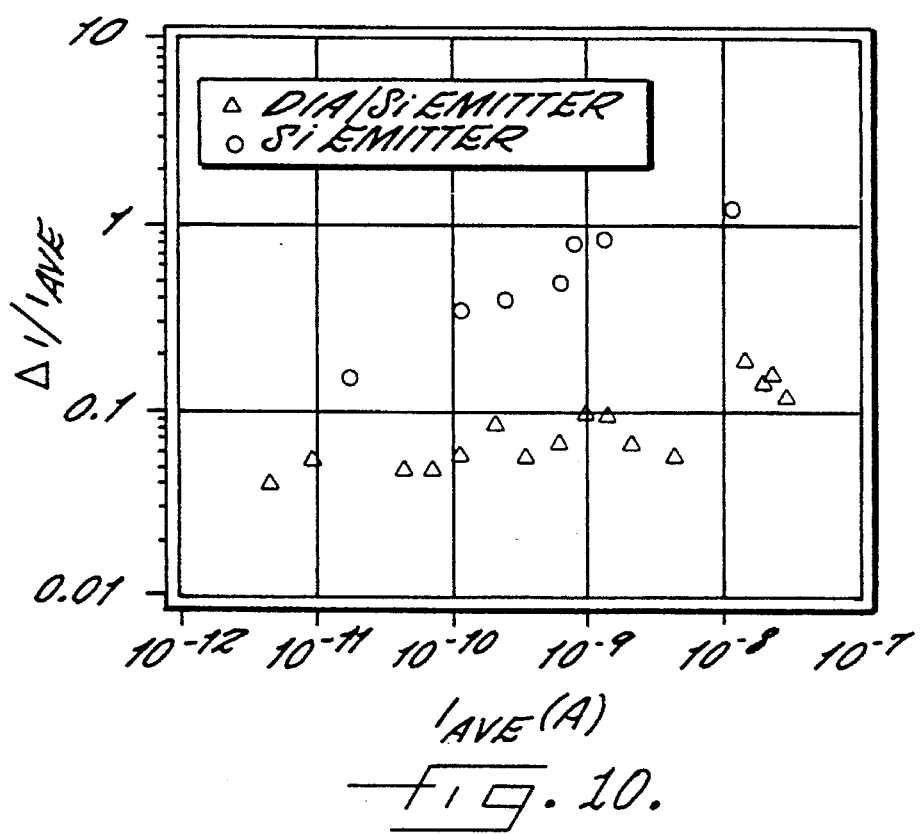
FIG. 10 is a graph of field emission characteristics of a diamond coated field emitter in accordance with the present invention compared to a silicon field emitter.

FIG. 10 shows measured emission stabilities for a pure Si emitter and diamond coated single and multi-emitters. It was found that the stability of diamond coated emitters was one to two orders of magnitude higher than that of a pure Si emitter. This may provide a strong verification for the above theory regarding the emitting area.

Another interesting phenomenon was the determination of the work function of diamond coated emitter surfaces. A parabolic model for the emitter surface was used in the approach. The effective work function of the diamond coated surface was estimated to range from 4.0 to 5.0 eV for emitters with radii of curvatures between 300 to 500 Angstroms. A more specific theoretical model may need to be considered for semiconductor emitters.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for making a field emitter for producing charged particles responsive to an applied electric field, the method comprising the steps of:

providing a projection;

electrically biasing the projection; and exposing the electrically biased projection to a hydrocarbon containing plasma to form a layer of diamond nuclei on the projection.

2. A method according to claim 1 further comprising the step of depositing diamond onto the diamond nuclei.

3. A method according to claim 2 wherein the step of depositing diamond comprises depositing diamond onto the diamond nuclei to form a plurality of diamond grains having a size of less than about 10 nanometers.

4. A method according to claim 1 wherein the step of providing the projection comprises providing a projection comprising a material capable of forming a carbide.

5. A method according to claim 4 wherein the step of electrically biasing the projection comprises electrically biasing the projection at a negative voltage; and wherein the step of exposing the electrically biased projection to a hydrocarbon containing plasma comprises exposing the electrically biased projection to a hydrocarbon containing plasma at a temperature, a pressure, and for a time period to form an intervening carbide layer at a surface of the projection and underlying the layer of diamond nuclei.

6. A method according to claim 5 wherein the step of electrically biasing the projection comprises electrically biasing the projection at a negative voltage; and wherein the step of exposing the electrically biased projection to a hydrocarbon containing plasma comprises exposing the electrically biased projection to a hydrocarbon containing plasma at a temperature, a pressure and for a time period to form an intervening carbide layer having a thickness in a range of about 20 to 100 Angstroms at a surface of the projection and underlying the layer of diamond nuclei.

7. A method according to claim 4 wherein the step of providing a projection comprising a material capable of forming a carbide comprises providing a projection comprising a refractory metal.

8. A method according to claim 4 wherein the step of providing a projection comprising a material capable of forming a carbide comprises providing a projection comprising silicon having one of a (111), (110) and (100) orientation.

9. A method according to claim 1 wherein the step of electrically biasing the projection comprises electrically biasing the projection at a negative voltage; and wherein the step of exposing the electrically biased projection to a hydrocarbon containing plasma comprises exposing the electrically biased projection to a hydrocarbon containing plasma at a temperature, at a pressure, and for a time period to form a nucleation density of the layer of diamond nuclei of greater than about $10^{10}/cm^2$.

10. A method according to claim 1 wherein the step of exposing the electrically biased projection to a hydrocarbon containing plasma comprises exposing the electrically biased projection to a plasma comprising about 2 to 5 percent by weight of methane in hydrogen.

11. A method according to claim 1 wherein the step of electrically biasing the projection comprises electrically biasing the projection at a voltage in a range of about −150 to −250 Volts.

12. A method according to claim 1 wherein the step of exposing the electrically biased projection to a hydrocarbon containing plasma comprises exposing the electrically biased projection to a hydrocarbon containing plasma at a pressure in a range of about 10 to 30 Torr.

13. A method according to claim 1 wherein the step of exposing the electrically biased projection to a hydrocarbon containing plasma comprises exposing the electrically biased projection to a hydrocarbon containing plasma at a temperature in a range of about 500° to 900° C.

14. A method according to claim 1 wherein the step of exposing the electrically biased projection to a hydrocarbon containing plasma comprises exposing the electrically biased projection to a hydrocarbon containing plasma for a time in a range of about 5 to 30 minutes.

15. A method according to claim 1 further comprising the step of cleaning the projection prior to electrically biasing same.

16. A method according to claim 15 wherein the step of cleaning comprises the step of exposing the projection to a hydrogen containing plasma.

17. A method according to claim 1 wherein the step of providing a projection comprises forming a projection having a radius of curvature of less than about 30 nm.

18. A method according to claim 17 wherein the step of forming a projection having a radius of curvature of less than about 30 nm comprises the steps etching and oxidizing the projection to thereby sharpen same.

19. A method for making a field emitter for producing charged particles responsive to an applied electric field, the method comprising the steps of:

providing a projection comprising a material capable of forming a carbide;

forming a carbide layer from surface portions of the projection; and forming a layer of diamond nuclei on the carbide layer.

20. A method according to claim 19 wherein the steps of forming a carbide layer and forming a layer of diamond nuclei thereon comprise electrically biasing the projection, and exposing the electrically biased projection to a hydrocarbon containing plasma.

21. A method according to claim 19 further comprising the step of depositing diamond onto the diamond nuclei.

22. A method according to claim 21 wherein the step of depositing diamond comprises depositing diamond onto the diamond nuclei to form a plurality of diamond grains having a size of less than about 10 nanometers.

23. (Amended) A method according to claim 20 wherein the step of electrically biasing the projection comprises electrically biasing the projection at a negative voltage; and wherein the step of exposing the electrically biased projection to a hydrocarbon containing plasma comprises exposing the electrically biased projection to a hydrocarbon containing plasma at a temperature, a pressure and for a time period to form the carbide layer having a thickness in a range of about 20 to 100 Angstroms at a surface of the projection and underlying the layer of diamond nuclei.

24. A method according to claim 19 wherein the step of providing a projection comprising a material capable of forming a carbide comprises providing a projection comprising a refractory metal.

25. A method according to claim 19 wherein the step of providing a projection comprising a material capable of forming a carbide comprises providing a projection comprising silicon having one of (111), (110) and (100) orientation.

26. A method according to claim 20 wherein the step of electrically biasing the projection comprises electrically biasing the projection at a negative voltage; and wherein the step of exposing the electrically biased projection to a hydrocarbon containing plasma comprises exposing the electrically biased projection to a hydrocarbon containing plasma at a temperature, at a pressure, and for a time period to form a nucleation density of the layer of diamond nuclei of greater than about $10^{10}/cm^2$.

27. A method according to claim 20 wherein the step of exposing the electrically biased projection to a hydrocarbon containing plasma comprises exposing the electrically biased projection to a plasma comprising about 2 to 5 percent by weight of methane in hydrogen.

28. A method according to claim 20 wherein the step of electrically biasing the projection comprises electrically biasing the projection at a voltage in a range of about −150 to −250 Volts.

29. A method according to claim 20 wherein the step of exposing the electrically biased projection to a hydrocarbon containing plasma comprises exposing the electrically biased projection to a hydrocarbon containing plasma at a pressure in a range of about 10 to 30 Torr.

30. A method according to claim 20 wherein the step of exposing the electrically biased projection to a hydrocarbon containing plasma comprises exposing the electrically biased projection to a hydrocarbon containing plasma at a temperature in a range of about 500° to 900° C.

31. A method according to claim 20 wherein the step of exposing the electrically biased projection to a hydrocarbon containing plasma comprises exposing the electrically biased projection to a hydrocarbon containing plasma for a time in a range of about 5 to 30 minutes.

32. A method for making a field emitter for producing charged particles responsive to an applied electric field, the method comprising the steps of:

providing a projection;

electrically biasing the projection;

exposing the electrically biased projection to a hydrocarbon containing plasma to form a layer of diamond nuclei on the projection;

removing the electrical bias from the projection; and depositing diamond onto the diamond nuclei to form a diamond layer.

33. A method according to claim 32 wherein the step of depositing diamond comprises depositing diamond onto the diamond nuclei to form a plurality of diamond grains having a size of less than about 10 nanometers.

34. A method according to claim 32 wherein the step of providing the projection comprises providing a projection comprising a material capable of forming a carbide.

35. A method according to claim 34 wherein the step of electrically biasing the projection comprises electrically biasing the projection at a negative voltage; and wherein the step of exposing the electrically biased projection to a hydrocarbon containing plasma comprises exposing the electrically biased projection to a hydrocarbon containing plasma at a temperature, a pressure, and for a time period to form an intervening carbide layer at a surface of the projection and underlying the layer of diamond nuclei.

36. A method according to claim 32 wherein the step of electrically biasing the projection comprises electrically biasing the projection at a negative voltage; and wherein the step of exposing the electrically biased projection to a hydrocarbon containing plasma comprises exposing the electrically biased projection to a hydrocarbon containing plasma at a temperature, at a pressure, and for a time period to form a nucleation density of the layer of diamond nuclei of greater than about $10^{10}/cm^2$.

37. A field emitter for producing charged particles responsive to an electric field applied thereto, said field emitter comprising:

a projection comprising a material capable of forming a carbide;

a carbide layer on said projection; and a diamond layer on said carbide layer.

38. A field emitter according to claim 37 wherein said projection comprises silicon.

39. A field emitter according to claim 38 wherein said silicon is one of (111), (110) and (111) oriented silicon.

40. A field emitter according to claim 37 wherein said projection comprises a refractory metal.

41. A field emitter according to claim 37 wherein said diamond layer has a nucleation density of greater than about $10^{10}/cm^2$.

42. A field emitter according to claim 37 wherein said diamond layer comprises a plurality of diamond grains each having a size of less than about 10 nanometers.

43. A microelectronic device for producing ions and comprising:

a projection;

a diamond layer on said projection;

an electrode spaced from said projection; and means for supplying a gas to be ionized into a region between said projection and said electrode.

44. A microelectronic device according to claim 43 wherein said projection comprises a material capable of forming a carbide, and further comprising a carbide layer between said projection and said diamond layer.

45. A microelectronic device according to claim 44 wherein said projection comprises silicon.

46. A microelectronic device according to claim 45 wherein said silicon is one of (111), (110) and (100) oriented silicon.

47. A microelectronic device according to claim 44 wherein said projection comprises a refractory metal.

48. A microelectronic device according to claim 43 wherein said diamond layer has a nucleation density of greater than about $10^{10}/cm^2$.

49. A microelectronic device according to claim 43 wherein said diamond layer comprises a plurality of diamond grains each having a size of less than about 10 nanometers.

* * * * *